(12) United States Patent
Choi

(10) Patent No.: US 9,837,387 B2
(45) Date of Patent: Dec. 5, 2017

(54) LIGHT EMITTING APPARATUS

(75) Inventor: Hyuck Jung Choi, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 221 days.

(21) Appl. No.: 13/434,510

(22) Filed: Mar. 29, 2012

(65) Prior Publication Data

US 2012/0248469 A1  Oct. 4, 2012

(30) Foreign Application Priority Data

Mar. 30, 2011 (KR) ........................ 10-2011-0029093

(51) Int. Cl.
| | |
|---|---|
| H01L 33/50 | (2010.01) |
| H01L 33/60 | (2010.01) |
| H01L 27/15 | (2006.01) |
| H01L 25/075 | (2006.01) |
| H01L 33/22 | (2010.01) |
| H01L 33/54 | (2010.01) |

(52) U.S. Cl.
CPC ........ *H01L 25/0753* (2013.01); *H01L 33/504* (2013.01); *H01L 33/507* (2013.01); *H01L 33/60* (2013.01); *H01L 33/22* (2013.01); *H01L 33/505* (2013.01); *H01L 33/54* (2013.01); *H01L 2224/48091* (2013.01); *H01L 2224/48137* (2013.01); *H01L 2224/49107* (2013.01); *H01L 2224/73265* (2013.01); *H01L 2924/1815* (2013.01)

(58) Field of Classification Search
None
See application file for complete search history.

(56) References Cited

U.S. PATENT DOCUMENTS

| 6,396,082 | B1 * | 5/2002 | Fukasawa et al. ............... 257/79 |
| 8,063,557 | B2 * | 11/2011 | Hsieh ..................... H01L 33/22 |
| | | | 313/116 |
| 8,283,686 | B2 | 10/2012 | Jagt et al. |
| 2004/0173810 | A1 * | 9/2004 | Lin ....................... H01L 33/486 |
| | | | 257/100 |
| 2006/0203468 | A1 | 9/2006 | Beeson et al. |
| 2006/0208268 | A1 | 9/2006 | Ueno et al. |
| 2007/0139949 | A1 * | 6/2007 | Tanda .................... F21K 9/135 |
| | | | 362/551 |
| 2008/0197373 | A1 * | 8/2008 | Kim ............................... 257/98 |

(Continued)

FOREIGN PATENT DOCUMENTS

| CN | 1835257 | 9/2006 |
| CN | 101034728 | 9/2007 |

(Continued)

*Primary Examiner* — Mark Tornow
*Assistant Examiner* — Priya Rampersaud
(74) *Attorney, Agent, or Firm* — H.C. Park & Associates, PLC

(57) ABSTRACT

A light emitting apparatus is disclosed. The light emitting apparatus includes a light-transmissive substrate having a top surface and a bottom surface, at least one semiconductor light emitting device disposed on the top surface of the light-transmissive substrate, a reflective part disposed over the semiconductor light emitting device to reflect light from the semiconductor light emitting device toward the light-transmissive substrate, and a first wavelength converter disposed between the light-transmissive substrate and the reflective part.

18 Claims, 5 Drawing Sheets

(56) References Cited

U.S. PATENT DOCUMENTS

| | | | |
|---|---|---|---|
| 2009/0167151 A1 | 7/2009 | Kolodin et al. | |
| 2009/0217970 A1* | 9/2009 | Zimmerman | F21K 9/00 136/252 |
| 2012/0138874 A1* | 6/2012 | Yuan | C09K 11/02 252/582 |
| 2013/0264600 A1* | 10/2013 | Lee | H01L 33/005 257/98 |

FOREIGN PATENT DOCUMENTS

| | | |
|---|---|---|
| CN | 101212015 | 7/2008 |
| CN | 101897040 | 11/2010 |
| JP | 2006-041553 | 2/2006 |
| JP | 2008-066691 | 3/2008 |
| KR | 10-2010-0010102 | 2/2010 |

\* cited by examiner

LIGHT EMITTING APPARATUS

CROSS-REFERENCE TO RELATED APPLICATION

This application claims priority from and the benefit of Koran Patent Application No. 10-2011-0029093, filed on Mar. 30, 2011, which is hereby incorporated by reference for all purposes as if fully set forth herein.

BACKGROUND OF THE INVENTION

Field of the Invention

Exemplary embodiments of the present invention relate to a light emitting apparatus. More particularly, exemplary embodiments of the present invention relate to a light emitting apparatus that uses a semiconductor light emitting device such as a light emitting diode as a light source.

Discussion of the Background

For a long period of time, cold cathode fluorescent lamps, referred to as "fluorescent lamps," have been widely used as indoor or outdoor illumination devices in buildings. However, the cold cathode fluorescent lamps have disadvantages such as a short lifespan, poor durability, a limited range of color selection of light and low energy efficiency.

Although light emitting diodes (LEDs) have several advantages such as an excellent responsiveness, high energy efficiency and long lifespan, the usage of light emitting diodes has been confined to limited areas such as backlight sources of a small-sized display device, and the like. However, as high-luminance, high-power white LEDs have been developed, LEDs have recently drawn attention as light sources of light illumination apparatuses.

A typical light emitting apparatus for illumination includes a semiconductor light emitting device such as a light emitting diode, and a substrate such as a printed circuit board. The semiconductor light emitting device may be directly mounted on the printed circuit board, or a package having the semiconductor light emitting device built therein may be mounted on a printed circuit board. When the semiconductor light emitting device is mounted on the substrate or package, a large amount of light is lost in a boundary between the semiconductor light emitting device and the substrate or package. Particularly, in case of a light emitting diode chip using a light-transmissive substrate such as a sapphire substrate as a semiconductor growth substrate or a support substrate, a large amount of light can be used through the light-transmissive substrate. However, the light may be blocked by the printed circuit board or package and the light intensity may be reduced.

SUMMARY OF THE INVENTION

Therefore, reducing light loss on a surface attached to an object such as a substrate, i.e., a chip mounting surface may be desirable.

If light that exits a chip mounting surface of a semiconductor light emitting device is used, the range of light emitted from the semiconductor light emitting device is considerably widened. In this case, a technique for concentrating light emitted within a wide range into a desired region or space is required.

Furthermore, a new phosphor arrangement technique is required in order to obtain light of a desired color, e.g., white light, by converting the wavelength of light emitted within a wide range as described above.

According to an aspect of the present invention, there is provided a light emitting apparatus including: a light-transmissive substrate having a top surface and a bottom surface, at least one semiconductor light emitting device disposed on the top surface of the light-transmissive substrate, a reflective part disposed over the semiconductor light emitting device to reflect light from the semiconductor light emitting device toward the light-transmissive substrate, and a first wavelength converter disposed between the light-transmissive substrate and the reflective part.

According to another aspect of the present invention, there is provided a light emitting apparatus including: a light-transmissive substrate having a top surface and a bottom surface, a plurality of semiconductor light emitting devices arranged on the top surface of the light-transmissive substrate, a reflector to reflect light emitted from the plurality of semiconductor light emitting devices toward the light-transmissive substrate, a first wavelength converter to convert a wavelength of the light reflected by the reflector, and a second wavelength converter to convert a wavelength of the light exiting from a bottom surface of the semiconductor light emitting device.

According to still another aspect of the present invention, there is provided a light emitting apparatus including: a light-transmissive substrate having a top surface and a bottom surface, a semiconductor light emitting device disposed on the top surface of the light-transmissive substrate, a reflective part disposed over the semiconductor light emitting device to reflect light from the semiconductor light emitting device toward the light-transmissive substrate, and a wavelength converter disposed on the light-transmissive substrate to convert a wavelength of the light emitted through the light-transmissive substrate.

The terms indicating orientations or directions, i.e., "top surface," "bottom surface," "upper side," "upper portion," "lower portion," and the like, which are used in the specification and claims, merely indicate relative position relations or orientations as shown in the accompanying drawings. For example, an element described as a "top surface" may substantially become a "bottom surface." On the contrary, an element described as a "bottom surface" may substantially become a "top surface."

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
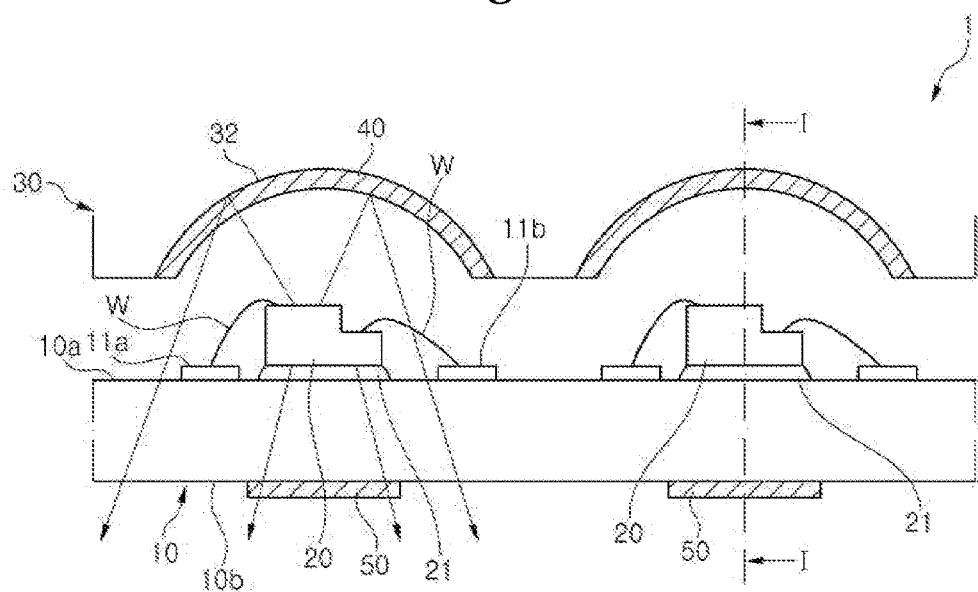
FIG. 1 is a cross-sectional view showing a light emitting apparatus according to an exemplary embodiment of the present invention.

The present invention will be described more fully hereinafter with reference to the accompanying drawings, in which exemplary embodiments of the invention are shown.

This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art.

In the drawings, the thickness of layers, films, panels, regions, etc., may be exaggerated for clarity. It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. In contrast, It will be understood that when an element such as a layer, film, region, or substrate is referred to as being "beneath" another element, it can be directly beneath the other element or intervening elements may also be present. Meanwhile, when an element is referred to as being "directly beneath" another element, there are no intervening elements present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Hereinafter, exemplary embodiments of the present invention will be explained in is detail with reference to the accompanying drawings.

Figure 2:
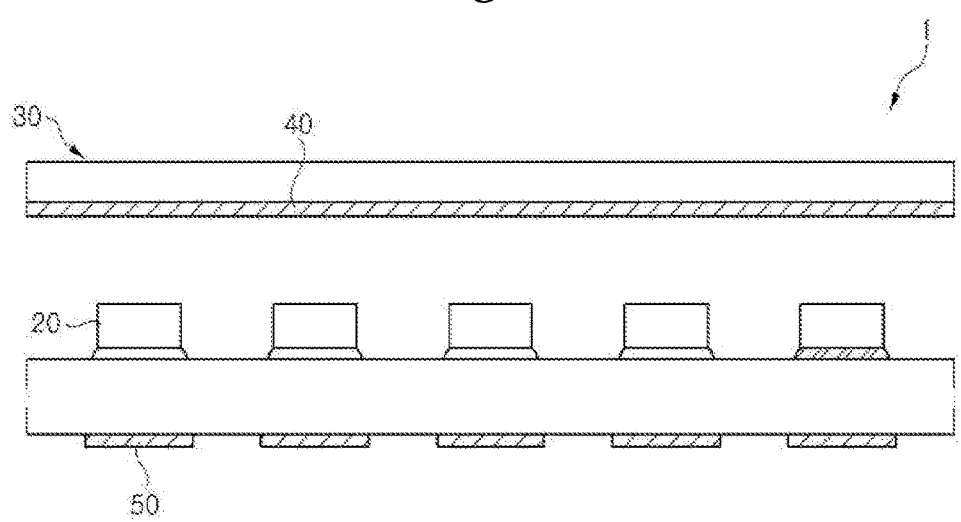
FIG. 2 is a cross-sectional view taken along line I-I of FIG. 1, showing the light emitting apparatus according to the exemplary embodiment of the present invention.

FIG. 1 is a cross-sectional view showing a light emitting apparatus according to an exemplary embodiment of the present invention; and FIG. 2 is a cross-sectional view taken along line I-I of FIG. 1, showing the light emitting apparatus according to an exemplary embodiment of the present invention.

Referring to FIG. 1 and FIG. 2, a light emitting apparatus 1 according to an exemplary embodiment of the present invention may include a light-transmissive substrate 10 which may be made of light-transmissive material, such as a glass material, semiconductor light emitting devices 20, a reflector 30, and first and second wavelength converters 40 and 50.

The light-transmissive substrate 10 includes a top surface 10a having the semiconductor light emitting device 20 disposed thereon, and a bottom surface 10b opposite to the top surface 10a. Electrode patterns 11a and 11b are formed on the top surface 10a of the light-transmissive substrate 10 so that power can be applied to the semiconductor light emitting device 20. The electrode patterns 11a and 11b may be formed of a material having conductivity and transmissivity, such as indium tin oxide (ITO). The electrode patterns 11a and 11b may be formed using a printing technique or the like. The light-transmissive substrate 10 may be not only a glass substrate but also a substrate of various materials having light transmissivity, e.g., a resin substrate, a quartz substrate, a ceramic substrate, and the like.

The semiconductor light emitting device 20 is disposed on the top surface 10a of the light-transmissive substrate 10. In this exemplary embodiment, the semiconductor light emitting device 20 includes p-type and n-type semiconductor layers, and may be a light emitting diode (LED) chip, which emits light from a light emitting region (or active region) between the p-type and n-type semiconductor layers. The semiconductor light emitting device 20 is attached is to the top surface 10a of the light-transmissive substrate 10 by an adhesive material 21 having light transmissivity. The semiconductor light emitting device 20 allows light to be emitted not only from top and side surfaces but also from a bottom surface thereof. For example, an LED chip including a light-transmissive substrate, such as a sapphire substrate, as a semiconductor growth substrate or semiconductor support substrate, allows light to be emitted not only from top and side surfaces but also from a bottom surface thereof. Light emitted from the bottom surface of the semiconductor light emitting device 20 is directed downward through the light-transmissive adhesive material 21 and the light-transmissive substrate 10. It is also possible to form a reflective insulation layer to cover the side surfaces of the semiconductor light emitting device.

Here, the desired direction of illumination of the light emitting apparatus 1, the illumination direction, is downward from the bottom surface of the light-transmissive substrate 10, i.e., a direction opposite to the direction in which the semiconductor light emitting device 20 is mounted.

In this exemplary embodiment, a plurality of semiconductor light emitting devices 20 may be arranged on the top surface 10a of the light-transmissive substrate 10. The semiconductor light emitting devices 20 may be arranged as a matrix array on the light-transmissive substrate 10. As shown in the drawings, the plurality of semiconductor light emitting devices may be arranged in two rows. Two electrode patterns 11a and 11b are provided for a semiconductor light emitting device 20. Electrodes of each semiconductor light emitting device 20 are connected to the electrode patterns 11a and 11b through bonding wires W, respectively.

The reflector 30 is disposed over the light-transmissive substrate 10 so as to be is spaced apart from the top surface 10a of the light-transmissive substrate 10. The semiconductor light emitting device 20 is disposed between the reflector 30 and the light-transmissive substrate 10. The reflector 30 and the semiconductor light emitting device 20 are spaced apart from each other. According to an exemplary embodiment, the space therebetween may be empty. The reflector 30 includes a plurality of reflective parts 32, which are provided at positions corresponding to the plurality of semiconductor light emitting devices 20. The reflective part 32 may be made of metallic material or high reflective resin material. Further, the reflective part 32 may be formed by depositing metallic material on a resin surface.

In this exemplary embodiment, each of the plurality of reflective parts 32 includes a reflective surface having a concave shape, and serves to reflect light emitted from the corresponding semiconductor light emitting device 20 to the light-transmissive substrate 10. The efficiency of light emission of the light emitting apparatus 1 may vary depending on the shape and size of the reflective part 32, and the reflective part 32 should be designed to have an appropriate size and shape, considering the desired angle of emission of the semiconductor light emitting device 20, an interval between the semiconductor light emitting devices 20, and the like. The reflector 30 may be designed so that only the reflective part 32 reflects light. Alternatively, the reflector 30 may be designed so that the entire surface of the reflector 30 reflects light.

The first wavelength converter 40 is disposed in a light path between the light-transmissive substrate 10 and the reflector 30, which allows the wavelength-converted light by the first wavelength converter 40 to be widely reflected by the reflector 30 and then to proceed externally, thereby contributing to reducing the disposal area of the first wavelength converter 40 and further reducing the amount of phosphor. Furthermore, as shown in the drawing, the first wavelength converters 40 may be disposed on the reflective parts 32 of the reflector 30, into which light beams are concentrated, so that the wavelength conversion efficiency can be improved to a higher degree with a small amount of phosphor.

In addition to the first wavelength converters 40, the light emitting apparatus 1 is also equipped with the second wavelength converters 50. The second wavelength converters 50 are disposed on the light-transmissive substrate 10. In this exemplary embodiment, the second wavelength converter 50 is disposed on the bottom surface of the light-transmissive substrate 10 so as to convert the wavelength of the light emitted from the bottom surface of the semiconductor light emitting device 20. The second wavelength converter 50 is disposed right below under one of the plurality of semiconductor light emitting devices 20, and may be formed to have an area slightly wider than that of the bottom surface of the semiconductor light emitting device 20, considering that the light emitted from the bottom surface of the semiconductor light emitting device 20 is spread more widely while passing through the light-transmissive substrate 10. The second wavelength converters 50 may be formed by coating a phosphor on the corresponding regions at the bottom surface 10b of the light-transmissive substrate 10.

The first wavelength converter 40 performs conversion of the wavelength of the light reflected by the reflector 30, and the second wavelength converter 50 performs conversion of the wavelength of the light not reflected by the reflector 30. Thus, it is possible to substantially uniformly convert the wavelength of the light emitted from the semiconductor light emitting device 20 and emit the wavelength-converted light externally. The wavelength converter 40 or 50 may include garnet, silicate and/or Nitride phosphor, but not limited thereto.

The light emitting apparatus 1 according to this exemplary embodiment may be implemented by appropriately disposing the light-transmissive substrate 10 equipped with the semiconductor light emitting device 20 and the like for a structure including the reflector 30 and is the first wavelength converters 50. For example, in case the reflector 30 and its related components are secured for use indoors or outdoors, the light emitting apparatus 1 may be implemented by mounting the structure with the light-transmissive substrate 10 equipped with the semiconductor light emitting device 20 and the like in a replaceable manner. In this case, the structure may be provided with a power supply terminal, and the light-transmissive substrate 10 or any other structure including the same may be provided with a terminal or socket through which the electrode patterns 11a and 11b on the light-transmissive substrate 10 are electrically connected to the power supply terminal. However, the light-transmissive substrate 10 of a glass material, the semiconductor light emitting device 20, the reflector 30, the first and second wavelength converters 40 and 50, and the like may be integrated in advance, and then, the light emitting apparatus 1 may be installed to any structure including a power source and/or a power supply terminal.

Hereinafter, various other exemplary embodiments of the present invention will be described. In the descriptions of the following exemplary embodiments, the descriptions overlapping with the aforementioned exemplary embodiment will be omitted, and the components identical or similar to those of the aforementioned exemplary embodiment may use the reference numerals used to describe the aforementioned exemplary embodiment.

Figure 3:
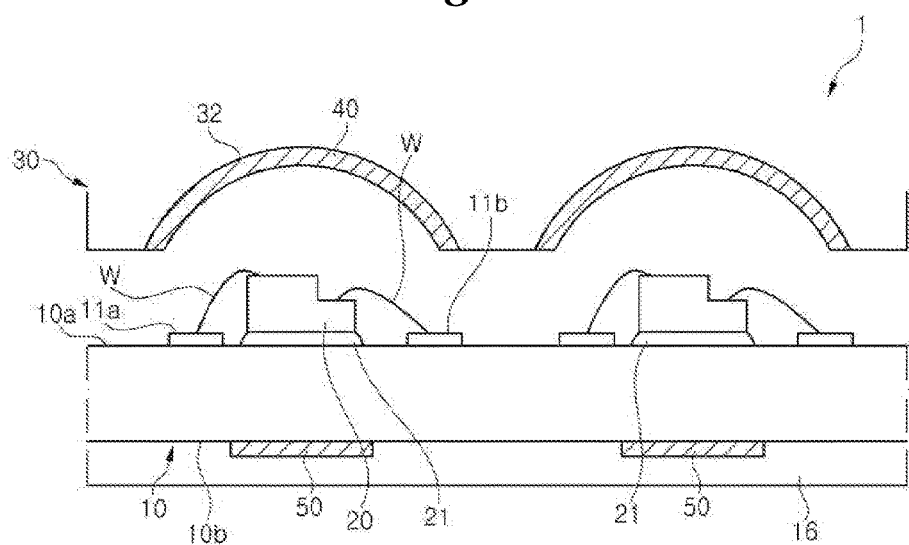
FIG. 3 to FIG. 9 are cross-sectional views illustrating various other exemplary embodiments of the present invention.

FIG. 3 is a cross-sectional view showing a light emitting apparatus according to another exemplary embodiment of the present invention.

Referring to FIG. 3, a light emitting apparatus 1 according to this exemplary embodiment further includes a light spreading part 16 disposed as a layer on the bottom surface 10b of the light-transmissive substrate 10. The light spreading part 16 is stacked on the bottom surface 10b of the light-transmissive substrate 10, and serves to increase the angle of direction of is light emission externally through the light-transmissive substrate 10. In this exemplary embodiment, the light spreading part 16 may include a concave groove in order to accommodate the second wavelength converter 50. The light spreading part 16 may be provided in a variety of manners, including attaching a spreading film to the bottom surface 10b of the light-transmissive substrate 10, coating a spreading material to the bottom surface 10b of the light-transmissive substrate 10, and the like.

Figure 4:
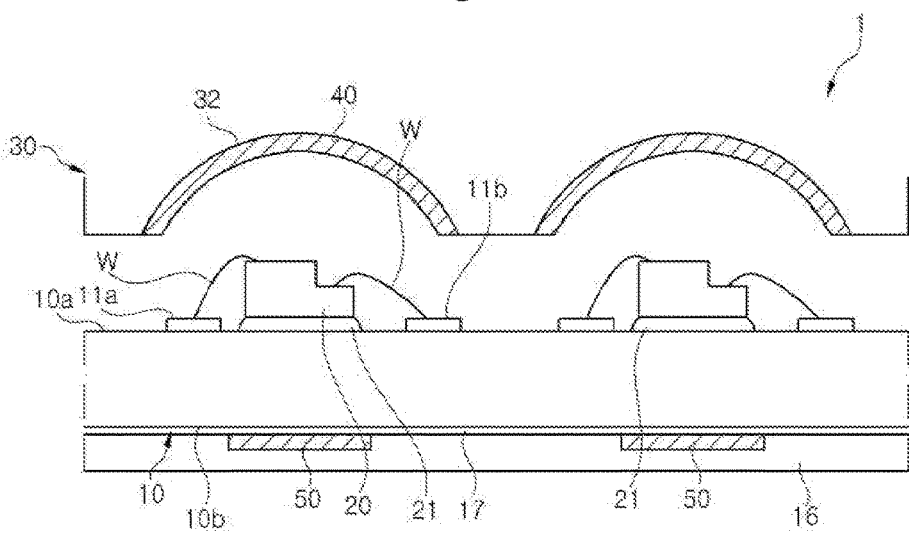

FIG. 4 is a cross-sectional view showing a light emitting apparatus according to still another exemplary embodiment of the present invention.

Referring to FIG. 4, an anti-retroreflection layer 17 is disposed on the bottom surface 10b of the light-transmissive substrate 10. The anti-retroreflection layer 17 is interposed between the light spreading part 16 and second wavelength converter 50 and the light-transmissive substrate 10 thereabove. The anti-retroreflection layer 17 reduces the light emitting through the light-transmissive substrate 10 reflected by the phosphor of the second wavelength converter 50 or other components and then retroreflected to the light-transmissive substrate 10. The anti-retroreflection layer 17 may be disposed throughout the entire region on the bottom surface 10b of the light-transmissive substrate 10. Alternatively, the anti-retroreflection layer 17 may be disposed only at a region corresponding to the semiconductor light emitting device 20. Also, the anti-retroreflection layer 17 may be disposed as a distributed Bragg reflector (DBR) to reflect the light with a specific wavelength band of the anti-retroreflection layer 17. In this case, the light retroreflected by colliding with the phosphor of the second wavelength converter 50 is reflected by the anti-retroreflection layer 17 with a DBR structure, and therefore, is not retroreflected into the light emitting apparatus 1. An anti-retroreflection layer identical or similar to that described above may also be disposed between the top surface of the light-transmissive is substrate 10 and the electrode pattern.

Figure 5:
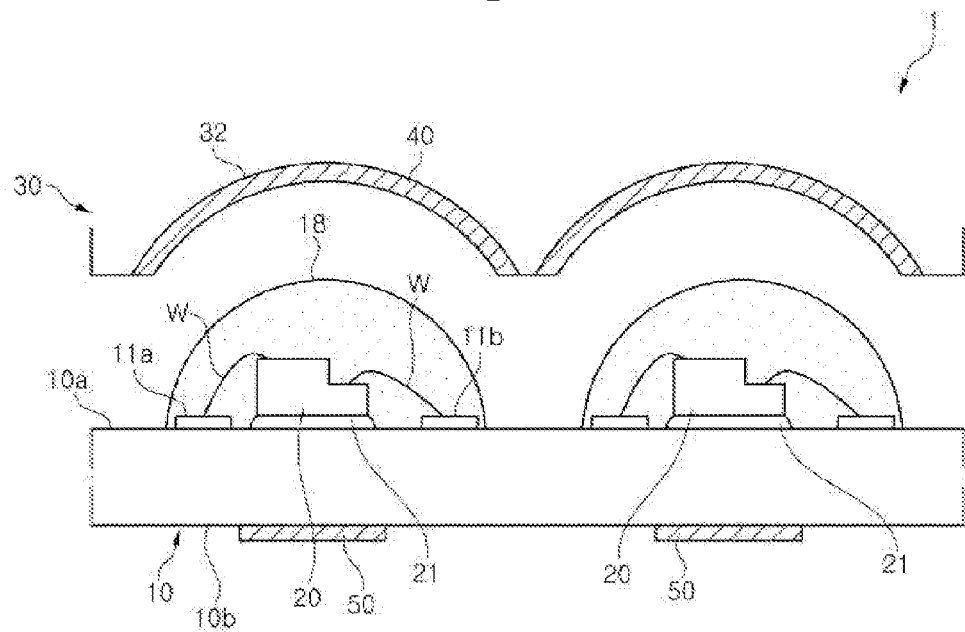

FIG. 5 is a cross-sectional view showing a light emitting apparatus according to still another exemplary embodiment of the present invention.

Referring to FIG. 5, a light emitting apparatus 1 according to this exemplary embodiment further includes light-transmissive encapsulants 18, each of which is formed on the top surface 10a of the light-transmissive substrate 10 to individually encapsulate the corresponding semiconductor light emitting device 20 and bonding wires W. The encapsulant 18 may be formed of, for example, epoxy or silicon resin. The encapsulant 18 may have a shape of a lens to enable the light emitted from the semiconductor light emitting device 20 to be concentrated into the corresponding reflective part 32.

Figure 6:
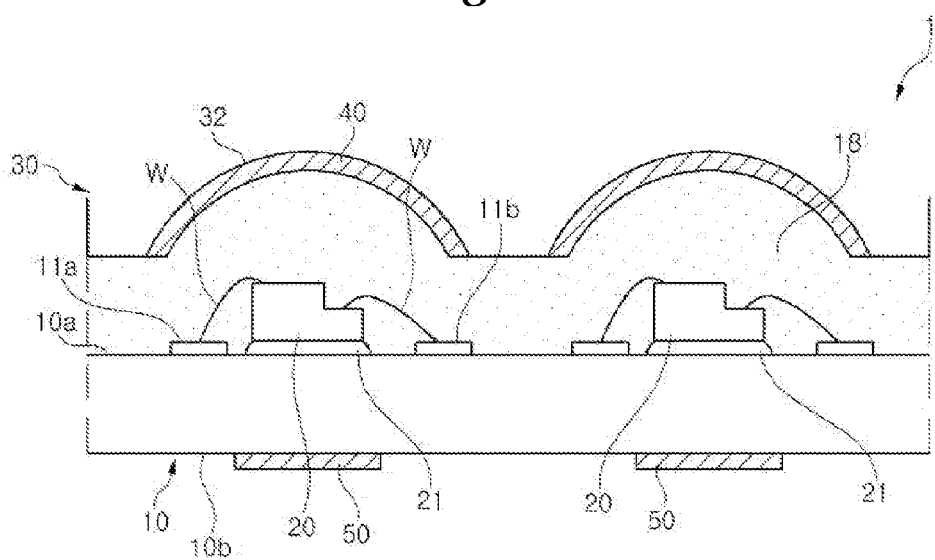

FIG. 6 is a cross-sectional view showing a light emitting apparatus according to still another exemplary embodiment of the present invention.

Referring to FIG. 6, a light emitting apparatus 1 according to this exemplary embodiment includes a light-transmissive encapsulant 18' to encapsulate the semiconductor light emitting part 20 and the bonding wires W, similar to the previous exemplary embodiment, but the space between the light-transmissive substrate 10 and the reflector 30 is filled with the light-transmissive encapsulant 18'. The light-transmissive encapsulant 18' preferably has a refractive index close to that of the light-transmissive substrate 10.

Figure 7:
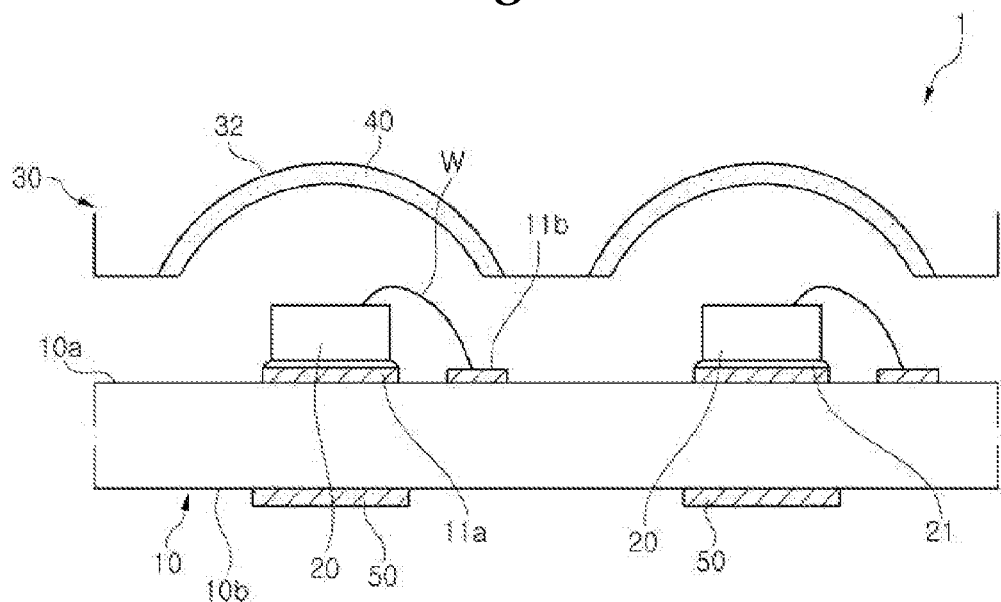

FIG. 7 is a cross-sectional view showing a light emitting apparatus according to still another exemplary embodiment of the present invention.

Referring to FIG. 7, a light emitting apparatus 1 according to this exemplary embodiment is provided with two or more electrode patterns 11a and 11b having different polarities for one semiconductor light emitting device 20, and the semiconductor light emitting is device 20 is directly mounted to one of the electrode patterns 11a and 11b. This may be suitable when a vertical LED chip or the like, in which at least one of opposite electrodes exists under the semiconductor light emitting device, is used as the semiconductor light emitting device. In this case, at least a portion of a lower electrode structure of the semiconductor light emitting device 20 preferably has light transmissivity. In the structure shown in FIG. 7, it is advantageous that an anti-retroreflection layer is formed between the top surface of the light-transmissive substrate 10 and the electrode pattern.

Figure 8:
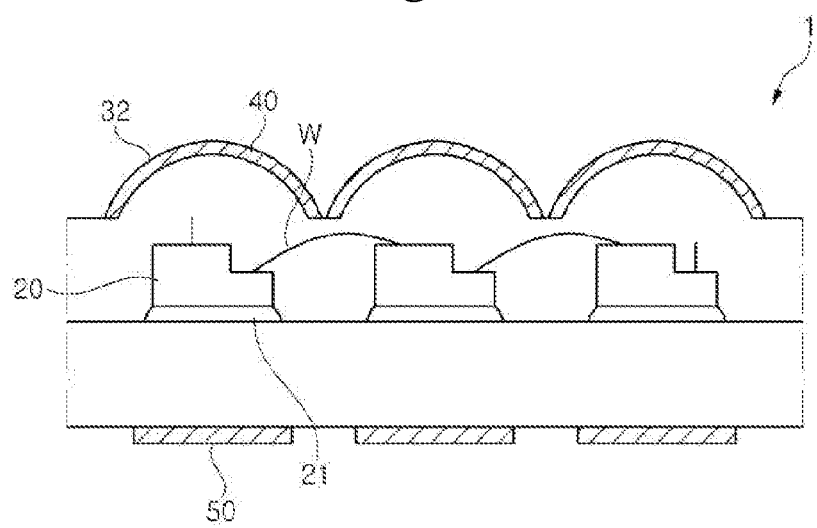

FIG. 8 is a cross-sectional view showing a light emitting apparatus according to still another exemplary embodiment of the present invention.

Referring to FIG. 8, in a light emitting apparatus 1 according to this exemplary embodiment, a plurality of semiconductor light emitting devices 10 on the top surface 10a of the light-transmissive substrate 10 are connected in series, thereby forming one serial array. Unlike the previous exemplary embodiment in which the electrode patterns 11a and 11b are provided for each of the semiconductor light emitting devices 11a and 11b, the electrode patterns are respectively provided only at both ends of the array.

Figure 9:
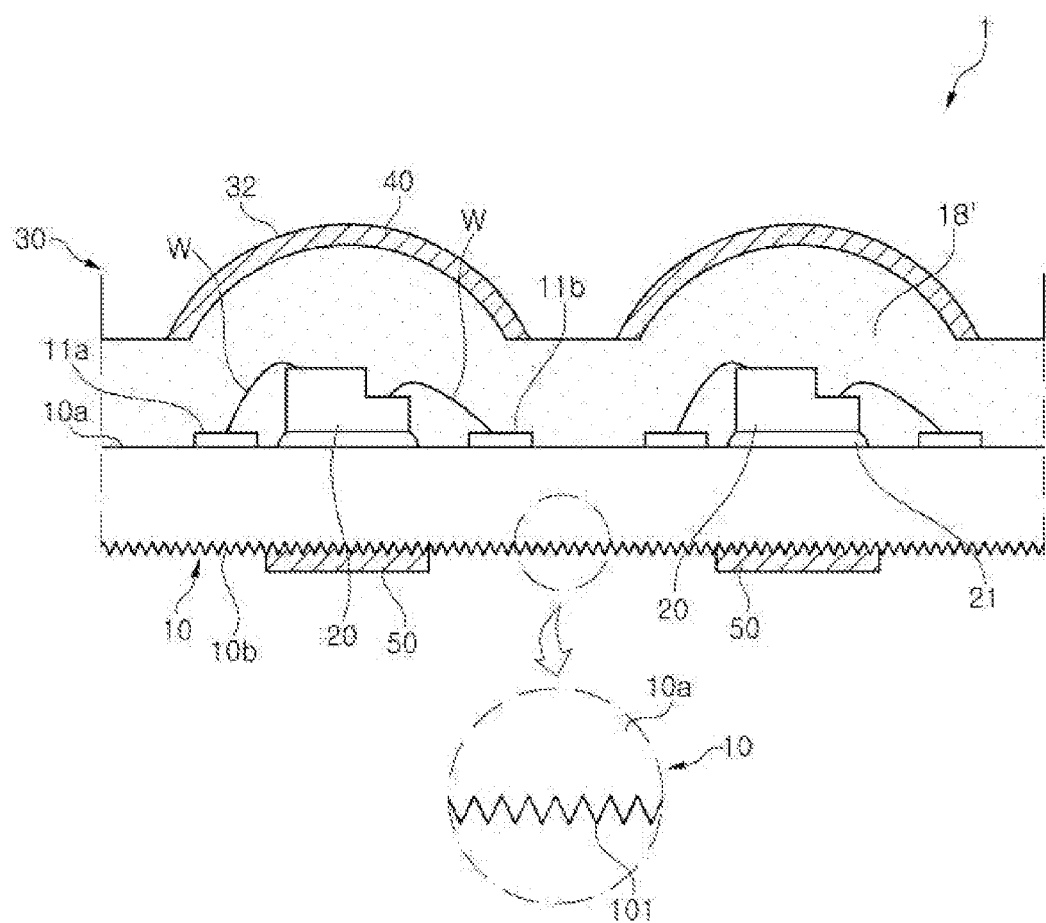

FIG. 9 is a cross-sectional view showing a light emitting apparatus according to still another exemplary embodiment of the present invention.

Referring to FIG. 9, in a light emitting apparatus 1 according to this exemplary embodiment, the light-transmissive substrate 10 includes top and bottom surfaces 10a and 10b, and the bottom surface 10b defining a boundary with a medium such as outer air is formed with patterns 101 to improve light emission. The patterns 101 may be regular or, alternatively, irregular. The patterns 101 may be formed through roughening, texturing, etching, or the like. Furthermore, if the light-transmissive substrate 10 is formed using a method such as molding, the is patterns 101 may be formed in a formation process.

Although not shown in the drawings, the bottom surface of the reflector 30 (See FIG. 1 to FIG. 8) and the top surface of the substrate 10 (See FIG. 1 to FIG. 8) may alternatively be in contact with each other. In this case, a semiconductor light emitting device, a conductive pattern, further an encapsulant and the like may be disposed in a spaced between the concave reflector and the substrate by allowing only a partial region of the reflector, e.g., a region of the concave reflector, in which the wavelength converter is formed, to be spaced apart from the top surface of the substrate.

According to the exemplary embodiments of the present invention, the availability of light emitted through the bottom surface of the semiconductor light emitting device can be increased, thereby improving the efficiency of light emission. Further, the light emitted through the top surface of the semiconductor light emitting device and the light emitted through the bottom surface of the semiconductor light emitting device can be uniformly wavelength-converted, thereby being applied to illumination and the like. Although layer 17 is shown in FIG. 4 only and layer 16 is shown in FIG. 3 and FIG. 4 only, each or both of these layers may be included in any exemplary embodiments.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:
1. A light emitting apparatus, comprising:
   a light-transmissive substrate comprising a top surface and a bottom surface;
   a semiconductor light emitting device disposed on the top surface of the light-transmissive substrate, wherein the semiconductor light emitting device is configured to emit light through the light-transmissive substrate;
   a reflective part disposed over the semiconductor light emitting device and configured to reflect light from the semiconductor light emitting device toward the light-transmissive substrate;
   a first wavelength converter disposed between the light-transmissive substrate and the reflective part, such that a first portion of light emitted from the semiconductor light emitting device and directed to the reflective part is converted by the first wavelength converter and a second portion of light emitted from the semiconductor light emitting device and directed to the reflective part passes through the first wavelength converter without wavelength conversion;
   a second wavelength converter disposed directly on the bottom surface of the light-transmissive substrate at a position corresponding to the semiconductor light emitting device, such that a third portion of light emitted from the semiconductor light emitting device and directed to the light-transmissive substrate is converted by the second wavelength converter; and
   a light-transmissive adhesive material disposed between the semiconductor light emitting device and the light-transmissive substrate,
   wherein the reflective part is configured to reflect the first portion of light converted by the first wavelength converter and the second portion of light passing through the first wavelength converter toward the light-transmissive substrate.

2. The light emitting apparatus according to claim 1, wherein the first wavelength converter is disposed in the reflective part.

3. The light emitting apparatus according to claim 1, wherein the reflective part has a concave surface.

4. The light emitting apparatus according to claim 1, wherein the second wavelength converter converts a wavelength of the light emitted through the light-transmissive substrate.

5. The light emitting apparatus according to claim 4, wherein the second wavelength converter converts a wavelength of the light emitted through the bottom surface of the semiconductor light emitting device.

6. The light emitting apparatus according to claim 1, wherein the first and second wavelength converters emit light having a same peak wavelength.

7. The light emitting apparatus according to claim 1, wherein the reflective part is integral with a reflector disposed over the light-transmissive substrate, and a space between the reflector and the light-transmissive substrate is empty.

8. The light emitting apparatus according to claim 7, further comprising an encapsulant individually encapsulating the semiconductor light emitting device in the space.

9. The light emitting apparatus according to claim 1, wherein the reflective part is integral with a reflector disposed over the light-transmissive substrate, and the space between the reflector and the light-transmissive substrate is filled with light-transmissive resin.

10. The light emitting apparatus according to claim 1, further comprising a light spreading part disposed on the bottom surface of the light-transmissive substrate.

11. The light emitting apparatus according to claim 1, further comprising a light spreading part to cover the second wavelength converter on the bottom surface of the light-transmissive substrate.

12. The light emitting apparatus according to claim 1, wherein an electrode pattern is disposed on the top surface of the light-transmissive substrate at a position corresponding to the semiconductor light emitting device, and the electrode pattern is light-transmissive.

13. The light emitting apparatus according to claim 1, wherein a light-transmissive electrode pattern is disposed on the top surface of the light-transmissive substrate at a position corresponding to the semiconductor light emitting device, and an anti-retroreflection layer is interposed between the light-transmissive substrate and the electrode pattern.

14. A light emitting apparatus, comprising:
a light-transmissive substrate comprising a top surface and a bottom surface;
a plurality of semiconductor light emitting devices arranged on the top surface of the light-transmissive substrate wherein the plurality of semiconductor light emitting devices is configured to emit light through the light-transmissive substrate;
a reflector configured to reflect light emitted in a first direction from the plurality of semiconductor light emitting devices toward the light-transmissive substrate;
a first wavelength converter configured to convert a wavelength of light emitted in the first direction from the plurality of semiconductor light emitting devices, such that a first portion of light emitted from the plurality of semiconductor light emitting devices in the first direction and directed to the reflector is converted by the first wavelength converter and a second portion of light emitted from the plurality of semiconductor light emitting devices and directed to the reflector passes through the first wavelength converter without wavelength conversion;
a second wavelength converter to convert a wavelength of light emitted in a second direction from the plurality of semiconductor light emitting devices, such that a third portion of light emitted from the plurality of semiconductor light emitting devices and directed to the light-transmissive substrate is converted by the second wavelength converter and a fourth portion of light emitted from the plurality of semiconductor light emitting devices and directed to the light-transmissive substrate passes through the second wavelength converter without wavelength conversion; and
a light-transmissive adhesive material disposed between the plurality of semiconductor light emitting devices and the light-transmissive substrate,
wherein the second wavelength converter is disposed directly on the bottom surface of the light-transmissive substrate at a position corresponding to the plurality of semiconductor light emitting devices, and
wherein the reflector is configured to reflect the first portion of light converted by the first wavelength converter and the second portion of light passing through the first wavelength converter toward the light-transmissive substrate.

15. The light emitting apparatus according to claim 14, wherein a plurality of first wavelength converters corresponding to the plurality of semiconductor light emitting devices are disposed in the reflector, and a plurality of second wavelength converters corresponding to the plurality of semiconductor light emitting devices are disposed on the bottom surface of the light-transmissive substrate.

16. The light emitting apparatus according to claim 14, wherein two or more electrode patterns for each of the plurality of semiconductor light emitting devices are disposed on the top surface of the light-transmissive substrate.

17. The light emitting apparatus according to claim 14, wherein the plurality of semiconductor light emitting devices are connected in series.

18. The light emitting apparatus according to claim 14, wherein the first and second wavelength converters emit light having a same peak wavelength.

* * * * *